United States Patent
Lin et al.

(10) Patent No.: US 6,586,142 B1
(45) Date of Patent: Jul. 1, 2003

(54) METHOD TO OVERCOME IMAGE DISTORTION OF LINES AND CONTACT HOLES IN OPTICAL LITHOGRAPHY

(75) Inventors: Chia-Hui Lin, Hsin-Chu (TW); Chun Ming Wang, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/408,702

(22) Filed: Sep. 30, 1999

(51) Int. Cl.7 ................................................. G03F 9/00
(52) U.S. Cl. .......................................................... 430/5
(58) Field of Search .............................. 430/5, 322, 296, 430/394; 395/500.2, 500.22

(56) References Cited

U.S. PATENT DOCUMENTS

| | | | |
|---|---|---|---|
| 5,082,762 A | 1/1992 | Takahashi | 430/296 |
| 5,112,724 A | 5/1992 | Bradshaw | 430/296 |
| 5,208,124 A | 5/1993 | Sporon-Fiedler et al. | 430/5 |
| 5,532,090 A | 7/1996 | Borodovsky | 430/5 |
| 5,804,339 A | 9/1998 | Kim | 430/5 |
| 6,087,046 A | * 7/2000 | Nakasuji | 430/5 |
| 6,110,647 A | * 8/2000 | Inoue et al. | 430/5 |
| 6,238,850 B1 | * 5/2001 | Bula et al. | 430/394 |

* cited by examiner

*Primary Examiner*—S. Rosasco
(74) *Attorney, Agent, or Firm*—George O. Saile; Stephen B. Ackerman

(57) ABSTRACT

A process to correct distortions due to optical proximity effects is described. A two reticle per pattern approach is used. The first, or primary, reticle contains the image that is to be transferred to the photoresist. It is used to expose the resist in the usual way to the correct dosage of light needed to optimally activate it. For a primary reticle bearing a line pattern, the second, or correction, reticle bears a pattern of rectangles which are located and dimensioned so that, when aligned relative to the primary reticle, they overlap all line ends in the pattern. The amount by which the rectangles overlap the lines is similar to the amount by which serifs (if they had been used) would overlap. The amount by which the rectangles extend outside the line ends is not critical (provided it is at least as large as the inside overlap amount). This property allows a single rectangle to be shared by many line ends. After the first exposure, the correction reticle is substituted for the primary reticle and, after alignment, a second, much shorter, exposure is given. The resist is then developed in the normal way, resulting in a patterned etch mask that is largely free of distortion. A similar approach applies to hole patterns except that a positive resist must be used.

20 Claims, 3 Drawing Sheets

*FIG. 1a - Prior Art*   *FIG. 1b - Prior Art*
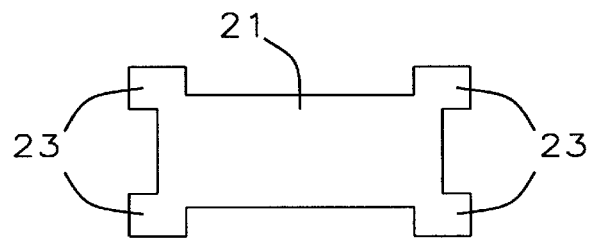
*FIG. 2 - Prior Art*
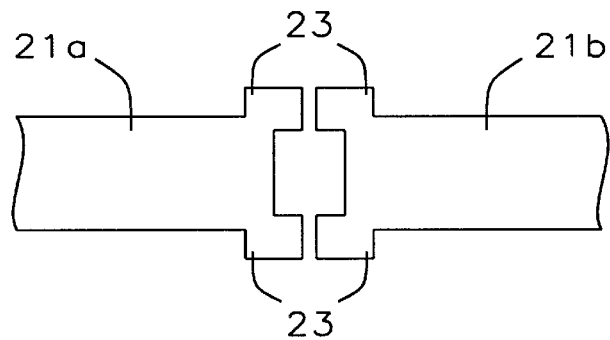
*FIG. 3 - Prior Art*
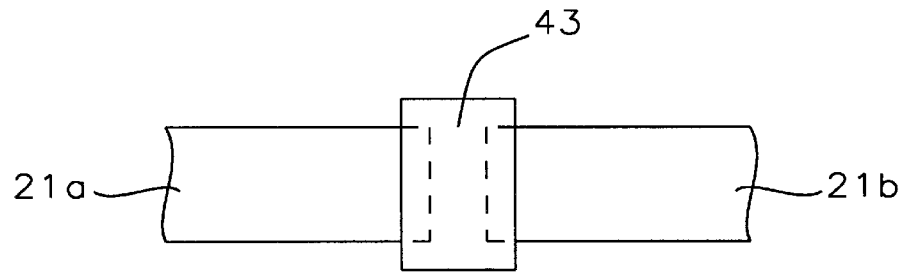
*FIG. 4*

METHOD TO OVERCOME IMAGE DISTORTION OF LINES AND CONTACT HOLES IN OPTICAL LITHOGRAPHY

FIELD OF THE INVENTION

The invention relates to the general field of photolithography with particular reference to optical proximity effects and methods to overcome them.

BACKGROUND OF THE INVENTION

Photolithography has been used, almost exclusively and for many years, to form the various components that make up integrated circuits. The continued increase in the density of components that can be placed on a chip has been largely due to advances in photolithography associated with using radiation of ever decreasing wavelengths. As long as the minimum size (critical dimension) of the components was greater than the wavelength of the radiation being used to expose the photoresist, advances in the art did not require any changes in the masks used other than to reduce the sizes of the components.

At a certain point in time the critical dimensions got to be less than about half the wavelength of the radiation being used, so radiation of lower wavelength had to be substituted. Eventually, critical dimensions reached, and then went below, the lower limit of optical lithography where conventional optics and resists can still be used (about 180 nm). Although it has been demonstrated that X-ray lithography is capable of producing patterns whose critical dimension is one or two orders of magnitude less than that, cost considerations have continued to drive conventional (optical) lithography to seek ways to image sub-optical critical dimensions while still using optical techniques.

When the wavelength of the imaging radiation gets to be less than the critical dimension, the effects of diffraction, though always present, become prominent enough to introduce noticeable distortions into the images projected relative to their original shapes on the imaging mask. These distortions are particularly sensitive to the distances between the various features in the pattern and are therefore often referred to as 'proximity effects'. In FIG. 1a we show an example of a line segment 11 that might appear within a typical line pattern while FIG. 1b shows how that line would end up in a photoresist mask formed using radiation less than about half the CD. The line image 12 can be seen to be shortened at both ends as well as being distorted because of rounding of the edges.

One effective way to deal with these has been to introduce distortions, known as serifs, into the original imaging pattern that compensate for the distortions that are introduced by the diffraction process. Serifs usually take the form of small squares (such as 23 in FIG. 2) that are superimposed on the corners where lines, such as 21, (in the pattern that is to be imaged) terminate. They may be custom generated through a lengthy process in which Fresnel diffraction theory is applied to compute the size, shape, and position of each serif individually or an average serif size may be preselected and then applied to all line ends in the pattern. The latter approach, while definitely less time consuming as far as computation is concerned, still requires each serif to be individually formed through electron beam imaging of the reticle pattern.

A general problem associated with the use of serifs (regardless of how they were generated) is illustrated in FIG. 3. This is the case of when two lines, such as 21a and 21b, have their ends close together so that serifs 23, routinely superimposed on the end corners, come so close to each other as to be unresolvable by the optical system. The result is the merger of adjacent serifs to form short circuiting bridges between the two lines 21a and 21b.

The present invention overcomes these problems by abandoning the use of serifs entirely, as will be described below. A routine search of the prior art was conducted but no references teaching the exact method of the present invention were found. Several references of interest were, however, encountered. For example, Kim (U.S. Pat No. 5,804,339) describes a process for manufacturing a photo mask (as opposed to an etch mask) using an electron beam. Conventional serif geometry is used to deal with corner rounding effects of the type associated with electron beams, namely the result of electron back-scattering (as opposed to the diffraction effects encountered during optical lithography). To minimize the effects of such back-scattering, Kim first does a normal exposure of the resist followed by a very brief second exposure through a mask that contains the serifs. The second exposure is between 0.75 and 2.25% of the first exposure. The method does not solve electron beam proximity effect problems that occur when two lines have ends close to each other (as discussed above for the optical case).

A similar method to Kim's is described by Takahashi (U.S. Pat No. 5,082,762), except that the exposure medium is an ion, rather than an electron, beam. Exposure to the beam is done in two steps, first the main mask and then the serifs.

Sporon-Fiedler et al. (U.S. Pat No. 5,208,124) describe a process intended for use with positive resists. For a pattern containing a mix of isolated and densely packed lines, lines are made narrower than their intended widths, the more isolated the line the greater the degree of narrowing. Proximity effects then have the opposite effect (i.e. the more densely packed the line the greater the shrinkage) so all widths come out the same.

Bradshaw (U.S. Pat No. 5,112,724) also teaches a two exposure process but the same mask is used for both exposures and no serifs are involved. Borodovsky (U.S. Pat No. 5,532,090) shows how fine holes can be formed by first partly exposing a pattern for holes that are larger than desired and then doing a second, reduced intensity, exposure using an aligned hole pattern having the desired dimension.

SUMMARY OF THE INVENTION

It has been an object of the present invention to provide a process for producing images by photolithography at wavelengths close to or below the CD.

Another object of the invention has been that said process be simple to apply and be equally effective for densely packed line patterns as well as isolated lines.

A further object of the invention has been that said process be suitable for hole patterns.

These objects have been achieved by providing a process based on a two reticle approach. The first, or primary, reticle contains the image that is to be transferred to the photoresist. It is used to expose the resist in the usual way to the correct dosage of light needed to optimally activate it. For a primary reticle bearing a line pattern, the second, or correction, reticle bears a pattern of rectangles which are located and dimensioned so that, when aligned relative to the primary reticle, they overlap all line ends in the pattern. The amount by which the rectangles overlap the lines is similar to the amount by which serifs (if they had been used) would have overlapped. The amount by which the rectangles extend outside the line ends is not critical (provided it is at least as large as the inside overlap amount). This property can be put to good use by allowing a single rectangle to be shared by many line ends. After the first exposure, the correction reticle is substituted for the primary reticle and, after alignment, a second, much shorter, exposure is given. The resist is then developed in the normal way, resulting in a patterned etch mask that is largely free of distortion. A similar approach applies to hole patterns except that a positive resist must be used. An important advantage of the process is that the rectangles can be generated from the original mask pattern using a simple geometric rule.

BRIEF DESCRIPTION OF THE DRAWINGS

FIG. 1a shows a line segment that is to be imaged into a layer of photoresist.

FIG. 1b shows how the line segment of FIG. 1a gets distorted because of optical proximity effects.

FIG. 2 shows how a line segment is modified by the addition of serifs at all corners.

FIG. 3 illustrates a prior art situation in which two line ends are very close, so serifs placed on the corners approach too close to each other to be optically resolved.

FIG. 4 shows how a rectangle can be used in place of serifs with the added advantage that two lines can share one rectangle.

DESCRIPTION OF THE PREFERRED EMBODIMENTS

The present invention is intended for the production of a patterned wafer (as opposed to an optical mask). It uses a two reticle approach for forming line and hole patterns. The first, or primary, reticle contains the image that is to be transferred to a layer of photoresist through an optical reduction system. Unlike most conventional approaches, the primary image, or pattern, is not corrected for optical proximity effects, being a somewhat enlarged version of the final desired pattern. It is used to expose the photoresist in the usual way to the correct dosage of light needed to optimally activate the resist. Said light has a wavelength between about 193 and 365 nm. The magnitude of the first exposure will vary, depending on the exposure tool being used, the type of resist, and the pattern density.

For a primary reticle bearing a line pattern (with line widths typically less than about 0.2 microns for 248 nm lithography), the second, or correction, reticle bears a pattern of rectangles which are located and dimensioned so that, when aligned relative to the primary reticle, they overlap all line ends in the pattern. The amount by which the rectangles overlap the lines is somewhat critical and corresponds to the amount by which the serifs of the prior art would overlap the line ends. The amount by which the rectangles extend outside the line ends is not critical (provided it is at least as large as the inside overlap amount). This property can be put to good use by allowing a single rectangle to be shared by a pair of line ends. This is illustrated in FIG. 4 where rectangle 43 is shared between lines 21a and 21b.

After the first exposure, the correction reticle is substituted for the primary reticle and, after alignment, a second exposure to light is given. This second exposure depends on the threshold energy and is between about 4 and 45% of the first exposure). This relationship to the first exposure is carefully chosen to be well below the activation threshold for any previously unexposed resist while still being large enough to raise previously under-exposed areas (such as diffraction minima at the lines edges) above the activation threshold.

After the second exposure, the resist is developed in the normal way, resulting in a patterned wafer that defines a pattern of lines having the correct dimensions as well as being free of distortion.

Figure 5:
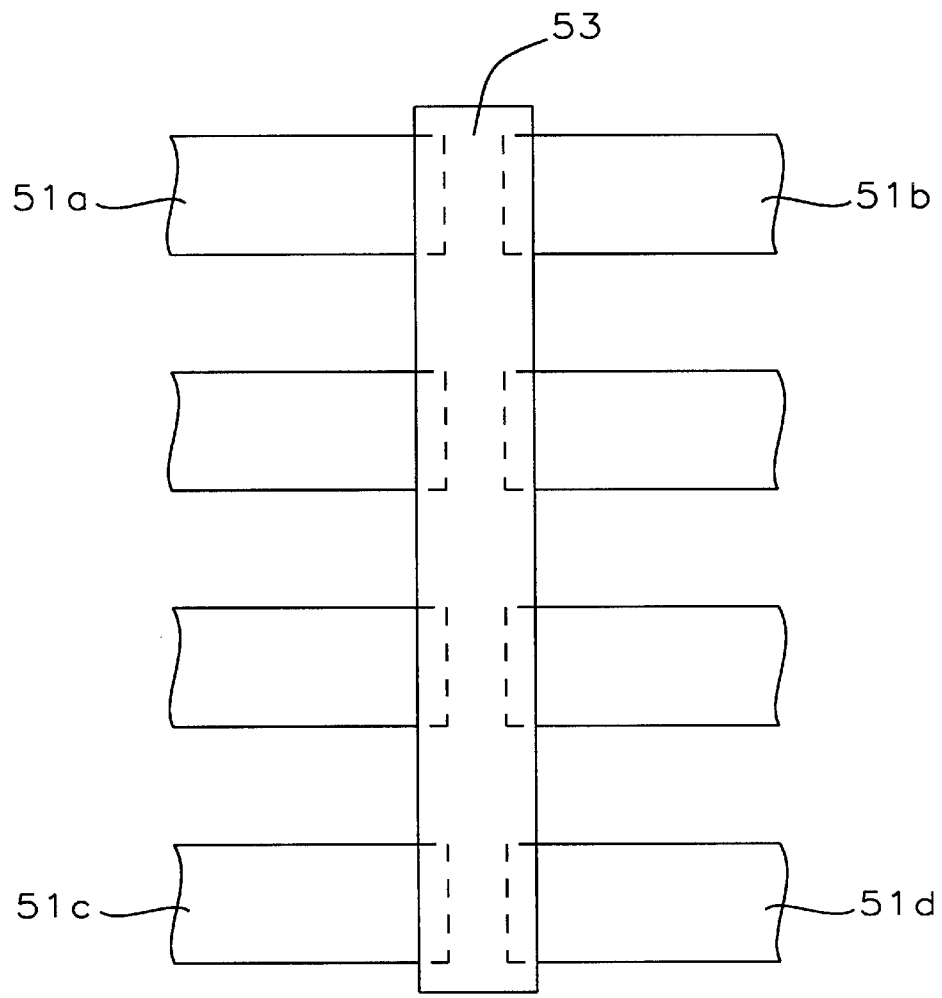
FIG. 5 shows how many lines can share a single rectangle.

The added cost of providing two reticles and using two exposures is more than made up by the reduction in the overall cost of mask production and pattern computation. Unlike serifs, the rectangles' positions and dimensions can be readily computed by applying a simple geometrical rule to the original line pattern. All that needs to be known is the location of each line's end and the line width. As already mentioned above, the same rectangle can be shared between two line ends. This feature can be generalized to allow one rectangle to serve a whole array of line ends as illustrated in FIG. 5 where the ends of four lines (as an example) such as 51a–d all share a single rectangle 53.

Figure 6:
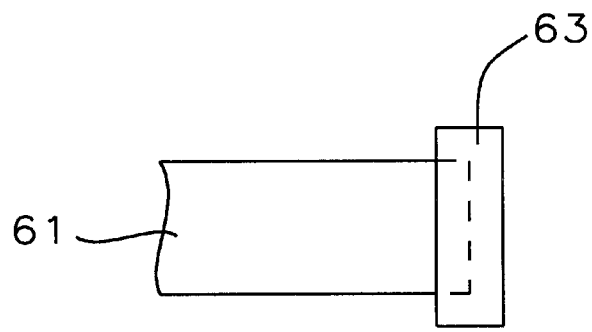
FIG. 6 illustrates use of the rectangle for a single isolated line.

An important feature of the present invention is that it applies equally well to densely packed lines as it does to isolated lines. An example of the latter is shown in FIG. 6 where rectangle 63 serves to correct for proximity effects to isolated line 61.

Figure 7:
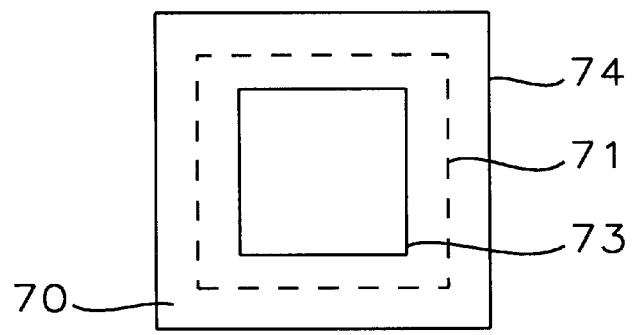
FIG. 7 shows how a frame pattern can be used to minimize distortions when a hole pattern is to be imaged onto the (negative) photoresist.

For a primary reticle bearing a hole pattern (with holes being typically less than about 0.25 microns wide for 248 nm lithography), a negative photoresist must be used. The second, or correction, reticle bears a pattern of frames which are located and dimensioned so that, when aligned relative to the primary reticle, the edges of the hole lie wholly inside the area of the frame. The amount by which the frames extend inside the holes is somewhat critical and corresponds to the amount referred to above for the lines (typically less than about 0.25 microns for 248 nm lithography). The amount by which the frames extend outside the hole's edges is not critical (provided it is at least as large as the inside overlap amount). This is illustrated in FIG. 7 where frame 70 is seen to enclose hole edge 71 between its inside border 73 and its outside border 74.

After the first exposure, the correction reticle is substituted for the primary reticle and, after alignment, a second exposure to light is given. This second exposure depends on the threshold energy and is between about 5 and 45% of the first exposure. This relationship to the first exposure is carefully chosen to be well below the activation threshold for any previously unexposed resist while still being large enough to raise under-exposed areas (such as diffraction minima at the lines edges) above the activation threshold.

After the second exposure, the resist is developed in the normal way, resulting in an etch mask that defines a pattern of holes having the correct dimensions as well as being free of distortion.

While the invention has been particularly shown and described with reference to the preferred embodiments thereof, it will be understood by those skilled in the art that various changes in form and details may be made without departing from the spirit and scope of the invention.

What is claimed is:

1. A method for forming a photoresist mask, on a wafer, for generating, through etching, a line pattern having specific dimensions, including lines having ends, comprising:

providing a primary reticle that bears an enlarged image of said line pattern;

directing light through an optical reduction system, that includes said primary reticle, whereby an image of said line pattern is focused onto a layer of photoresist, with light impinging on the photoresist for a first time period that is sufficient to exceed the activation threshold of any previously unexposed resist;

providing a correction reticle that bears a pattern of rectangles and replacing the primary reticle with the correction reticle in the optical reduction system;

then directing light through the optical reduction system, whereby an image of said rectangles is focused onto the layer of photoresist, said rectangles being aligned so as to overlap said line ends by an amount, with light impinging on the photoresist for a second time period that is insufficient to exceed the activation threshold of any previously unexposed resist; and then developing the photoresist, thereby forming an etch mask that defines a pattern of lines having said specific dimensions as well as undistorted ends.

2. The method of claim 1 wherein the light has a wavelength that is between about 193 and 365 nm.

3. The method of claim 1 wherein the first time period depends on the exposure tool being used, the type of resist, and the pattern density.

4. The method of claim 1 wherein the second time period is between about 5 and 45% of said first time period.

5. The method of claim 1 wherein the amount by which the rectangles overlap the line ends is between about 0.05 and 0.18 microns.

6. The method of claim 1 wherein one rectangle overlaps more than one line end.

7. The method of claim 1 wherein said specific dimensions include line widths between about 0.16 and 0.35 microns.

8. The method of claim 1 wherein said line pattern contains lines that are densely packed and lines that are isolated from other lines.

9. A method for forming a photoresist mask, on a wafer, for generating, through etching, a hole pattern having specific dimensions, comprising:

providing a primary reticle that bears an enlarged image of said hole pattern;

directing light through an optical reduction system, that includes said primary reticle, whereby an image of said hole pattern is focused onto a layer of negative photoresist, with light impinging on the photoresist for a first time period that is sufficient to exceed the activation threshold of any previously unexposed resist;

providing a correction reticle that bears a pattern of a frame, said frame having inside dimensions less than said specific dimensions and outside dimensions greater than said specific dimensions, and replacing the primary reticle with the correction reticle in the optical reduction system;

then directing light through the optical reduction system, whereby an image of said frame is focused onto the layer of positive photoresist, said frame being symmetrically aligned relative to the hole, with light impinging on the photoresist for a second time period that is insufficient to exceed the activation threshold of any previously unexposed resist; and then developing the photoresist, thereby forming an etch mask that defines a hole having said specific dimensions as well as being undistorted.

10. The method of claim 9 wherein the light has a wavelength that is between about 193 and 365 nm.

11. The method of claim 9 wherein the first time period depends on the exposure tool being used, the type of resist, and the pattern density.

12. The method of claim 9 wherein the second time period is between about 5 and 45% of said first time period].

13. The method of claim 9 wherein the frame has a width between about 0.05 and 0.18 microns.

14. The method of claim 9 wherein the frame has dimensions between about 5 and 45% of said specific dimensions.

15. A correction mask for overcoming distortion in an image formed in photoresist from a primary mask that includes a pattern of lines, some of which have ends, comprising:

a set of rectangles located so that, when the correction mask is in alignment with the primary mask, each rectangle overlaps at least one of said line ends by an amount.

16. The correction mask described in claim 15 wherein the amount by which the rectangles overlap the line ends is between about 0.05 and 0.18 microns.

17. The correction mask described in claim 15 wherein the set of rectangles is generated through application of a simple geometric rule to said line pattern.

18. A correction mask for overcoming distortion of an image of a hole having an edge, formed in positive photoresist from a primary mask, comprising:

a frame, having borders, located and dimensioned so that, when the correction mask is in alignment with the primary mask, the edges of the hole are entirely within said borders.

19. The correction mask described in claim 18 wherein the frame overlaps the hole by between about 0.05 and 0.18 microns.

20. The correction mask described in claim 18 wherein the frame is generated through application of a simple geometric rule to said hole pattern.

* * * * *